(12) United States Patent
Lee et al.

(10) Patent No.: US 10,749,527 B2
(45) Date of Patent: Aug. 18, 2020

(54) LEVEL SHIFTING CIRCUIT

(71) Applicant: SAMSUNG ELECTRONICS CO., LTD., Suwon-si, Gyeonggi-do (KR)

(72) Inventors: Dalhee Lee, Seoul (KR); Jintae Kim, Daejeon (KR); Jaeha Lee, Anyang-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/056,072

(22) Filed: Aug. 6, 2018

(65) Prior Publication Data

US 2018/0367144 A1    Dec. 20, 2018

Related U.S. Application Data

(62) Division of application No. 15/285,348, filed on Oct. 4, 2016, now abandoned.

(30) Foreign Application Priority Data

Oct. 26, 2015    (KR) .......................... 10-2015-0148949

(51) Int. Cl.
*H03K 19/0175*    (2006.01)
*H03K 19/0185*    (2006.01)

(52) U.S. Cl.
CPC ............................ *H03K 19/018521* (2013.01)

(58) Field of Classification Search
CPC ..... H03K 19/018521; H03K 3/356113; H03K 19/00315; H03K 19/018535; H03K 19/018528; G11C 8/08
See application file for complete search history.

(56) References Cited

U.S. PATENT DOCUMENTS

| | | | |
|---|---|---|---|
| 5,627,485 A | * | 5/1997 | Casper ................. H03K 17/223 327/530 |
| 6,442,082 B2 | | 8/2002 | Taura et al. |
| 6,734,705 B2 | | 5/2004 | Pulkin et al. |
| 7,545,174 B2 | | 6/2009 | Senda et al. |
| 7,772,884 B2 | | 8/2010 | Kwon |
| 8,368,425 B2 | * | 2/2013 | Huang ............. H03K 3/356182 326/68 |
| 8,847,661 B2 | | 9/2014 | Choung |
| 8,975,927 B2 | | 3/2015 | Hwang et al. |
| 9,191,006 B1 | * | 11/2015 | Lin ................ H03K 19/017509 |
| 2004/0041587 A1 | | 3/2004 | Tanaka et al. |
| 2004/0207450 A1 | | 10/2004 | Ando |

(Continued)

FOREIGN PATENT DOCUMENTS

| KR | 10-0711516 | 4/2007 |
|---|---|---|
| KR | 10-2007-0080969 | 8/2007 |

(Continued)

*Primary Examiner* — Long Nguyen
(74) *Attorney, Agent, or Firm* — F. Chau & Associates, LLC

(57) ABSTRACT

A level shifting circuit includes a level shifting portion configured to receive an input signal and generate an output signal, and a current adjustment circuit connected between the level shifting portion and a drive high voltage node at which a drive high voltage is applied. The current adjustment circuit is configured to adjust an amount of current provided from the drive high voltage node to the level shifting portion.

5 Claims, 12 Drawing Sheets

(56) References Cited

U.S. PATENT DOCUMENTS

| | | |
|---|---|---|
| 2007/0247209 A1 | 10/2007 | Chen |
| 2008/0265970 A1 | 10/2008 | Vlasenko |
| 2009/0189670 A1 | 7/2009 | Yang et al. |
| 2012/0154014 A1* | 6/2012 | Nakashima ...... H03K 3/356182 327/333 |
| 2017/0117898 A1 | 4/2017 | Lee et al. |

FOREIGN PATENT DOCUMENTS

| | | |
|---|---|---|
| KR | 10-2007-0116451 | 12/2007 |
| KR | 10-2012-0025769 | 3/2012 |
| KR | 10-2014-0031764 | 3/2014 |
| KR | 10-2014-0064976 | 7/2014 |

* cited by examiner

LEVEL SHIFTING CIRCUIT

CROSS-REFERENCE TO RELATED APPLICATIONS

This application is a divisional application of U.S. patent application Ser. No. 15/285,348, filed on Oct. 4, 2016, which claims priority under 35 U.S.C. § 119 to Korean Patent Application No. 10-2015-0148949 filed on Oct. 26, 2015, the disclosure of which is hereby incorporated by reference in its entirety.

TECHNICAL FIELD

Exemplary embodiments of the inventive concept described herein relate to a semiconductor device, and more particularly, to a level shifting circuit capable of reducing a malfunction.

DISCUSSION OF THE RELATED ART

As the mobile market expands, various operating conditions become important. For example, an important operating condition in the mobile market is efficient battery usage by a mobile device that uses a battery of a limited capacity. To satisfy this condition, various power-saving methods are used. One such method includes supplying different voltages to function blocks constituting the mobile device. For example, a high voltage may be applied to one function block of the mobile device, and a low voltage may be applied to another function block of the mobile device.

A level shifting circuit receives an input voltage and outputs an output voltage different from the input voltage. For example, a level shifting circuit may receive an input voltage and supply an output voltage to function blocks of an electronic device such as a mobile device. Accordingly, the level shifting circuit supplies various output voltages that are used by various function blocks in an electronic device such as a mobile device.

SUMMARY

Exemplary embodiments of the inventive concept provide a level shifting circuit capable of reducing a malfunction regardless of a difference between a drive high voltage and a drive low voltage.

According to an exemplary embodiment of the inventive concept, a level shifting circuit includes a level shifting portion and a current adjustment circuit. The level shifting portion is configured to receive an input signal driven with a first voltage, and to generate an output signal driven with a second voltage provided through a node of a drive high voltage. The current adjustment circuit is connected between the node at which the drive high voltage is applied and the level shifting portion, and is configured to adjust an amount of current provided from the node at which the drive high voltage is applied to the level shifting portion. The current adjustment circuit includes a first current adjustment transistor connected between the node at which the drive high voltage is applied and the level shifting portion and configured to adjust a first current to be provided to a first node of the level shifting portion, and a second current adjustment transistor connected between the node at which the drive high voltage is applied and the level shifting portion and configured to adjust a second current to be provided to a second node of the level shifting portion. The first and second current adjustment transistors are turned on regardless of the input signal.

According to an exemplary embodiment of the inventive concept, a level shifting circuit includes a first transistor connected between a ground terminal and a first node and turned on according to an input signal, a second transistor connected between the ground terminal and an output node for outputting an output signal corresponding to the input signal and turned on according to an inverted signal of the input signal, a first current adjustment transistor connected between the first node and a second node and turned on regardless of the input signal, a second current adjustment transistor connected between the output node and a third node and turned on regardless of the input signal, a third transistor connected between the second node and a fourth node and turned on according to the input signal, a fourth transistor connected between the third node and a fifth node and turned on according to the inverted signal of the input signal, a fifth transistor connected between the fourth node and a node at which a drive high voltage is applied and turned on according to a voltage level of the third node, and a sixth transistor connected between the fifth node and the node at which the drive high voltage is applied and turned on according to a voltage level of the second node. A voltage level of the output signal is determined based on the drive high voltage.

According to an exemplary embodiment of the inventive concept, a level shifting circuit includes a first transistor connected between a ground terminal and a first node and turned on according to an input signal, a second transistor connected between the ground terminal and an output node for outputting an output signal corresponding to the input signal and turned on according to an inverted signal of the input signal, a third transistor connected between the first node and a second node and turned on according to the input signal, a fourth transistor connected between the output node and a third node and turned on according to the inverted signal of the input signal, a first current adjustment transistor connected between the second node and a fourth node and turned on regardless of the input signal, a second current adjustment transistor connected between the third node and a fifth node and turned on regardless of the input signal, a fifth transistor connected between the fourth node and a node at which a drive high voltage is applied and turned on according to the output signal, and a sixth transistor connected between the fifth node and the node at which the drive high voltage is applied and turned on according to a voltage level of the first node. A voltage level of the output signal is determined based on the drive high voltage.

According to an exemplary embodiment of the inventive concept, a level shifting circuit includes a level shifting portion and a current adjustment circuit. The level shifting portion is configured to receive an input signal and generate an output signal. The current adjustment circuit is connected between the level shifting portion and a drive high voltage node at which a drive high voltage is applied, and is configured to adjust an amount of a current provided from the drive high voltage node to the level shifting portion. The current adjustment circuit includes a first current adjustment transistor connected between the drive high voltage node and the level shifting portion, and configured to adjust a first current to be provided to a first node of the level shifting portion. The current adjustment circuit further includes a second current adjustment transistor connected between the drive high voltage node and the level shifting portion, and configured to adjust a second current to be provided to a second node of the level shifting portion. The first and second current adjustment transistors are turned on regardless of the input signal.

In an exemplary embodiment, the level shifting portion includes a first transistor connected between a ground terminal and a third node and turned on according to the input signal, a second transistor connected between the ground terminal and an output node outputting the output signal and turned on according to an inverted signal of the input signal, a third transistor connected between the first node and a fourth node and turned on according to the output signal, a fourth transistor connected between the second node and a fifth node and turned on according to a voltage level of the third node, a fifth transistor connected between the fourth node and the third node and turned on according to the input signal, and a sixth transistor connected between the fifth node and the output node and turned on according to the inverted signal of the input signal.

In an exemplary embodiment, the current adjustment circuit further includes at least one third current adjustment transistor serially connected between the first current adjustment transistor and the drive high voltage node, and at least one fourth current adjustment transistor serially connected between the second current adjustment transistor and the drive high voltage node. The third and fourth current adjustment transistors are turned on regardless of the input signal.

In an exemplary embodiment, the level shifting circuit further includes at least one third current adjustment transistor serially connected between the drive high voltage node and the first current adjustment transistor and turned on according to the input signal, and at least one fourth current adjustment transistor serially connected between the drive high voltage node and the second current adjustment transistor and turned on according to an inverted signal of the input signal.

In an exemplary embodiment, the level shifting circuit further includes at least one third current adjustment transistor serially connected between the third transistor and the fifth transistor and turned on according to the input signal, and at least one fourth current adjustment transistor serially connected between the fourth transistor and the sixth transistor and turned on according to the inverted signal of the input signal.

In an exemplary embodiment, the first and second transistors are turned on when a first voltage level is applied to a gate terminal of each of the first and second transistors, and the third to sixth transistors and the first and second current adjustment transistors are turned on when a second voltage level different from the first voltage level is applied to a gate terminal of each of the third to sixth transistors and the first and second current adjustment transistors.

In an exemplary embodiment, the fourth and sixth transistors are turned on when the first transistor is turned on, and the third and fifth transistors are turned on when the second transistor is turned on.

In an exemplary embodiment, the level shifting circuit further includes an inverter that receives and inverts the input signal.

According to an exemplary embodiment of the inventive concept, a level shifting circuit includes a level shifting portion configured to receive an input signal and generate an output signal, and a current adjustment circuit connected between the level shifting portion and a drive high voltage node at which a drive high voltage is applied. The current adjustment circuit includes a first current adjustment transistor connected between the drive high voltage node and the level shifting portion, and a second current adjustment transistor connected between the drive high voltage node and the level shifting portion. A gate terminal of each of the first and second current adjustment transistors is connected to a ground terminal.

BRIEF DESCRIPTION OF THE DRAWINGS

The above and other features of the present inventive concept will become apparent by describing in detail exemplary embodiments thereof with reference to the accompanying drawings, in which.

DETAILED DESCRIPTION

Figure 1:
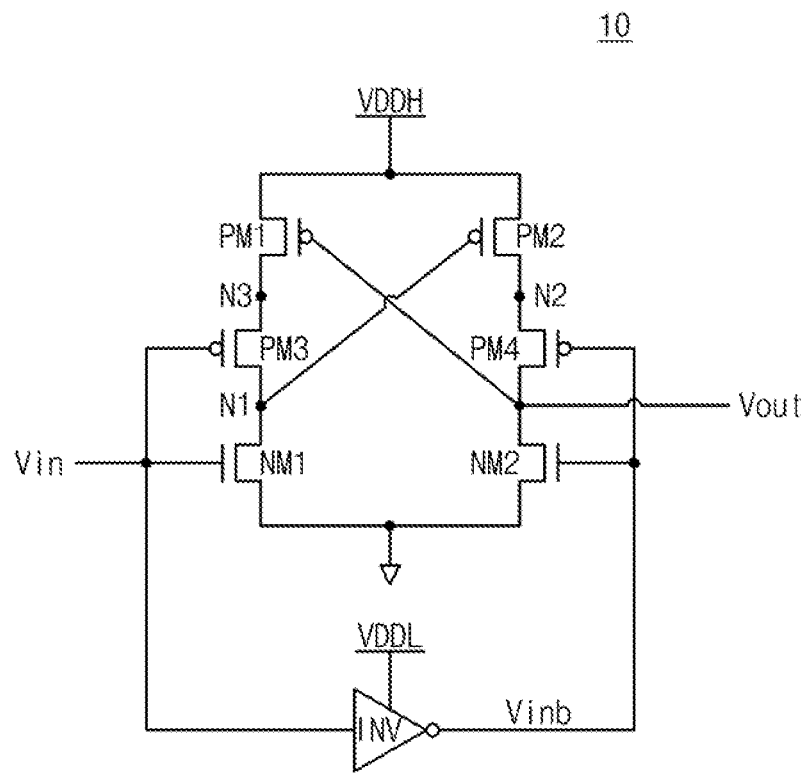
FIG. 1 is a circuit diagram illustrating a conventional level shifting circuit.

Exemplary embodiments of the present inventive concept will be described more fully hereinafter with reference to the accompanying drawings. In the drawings, the size and relative sizes of elements, layers and regions may be exaggerated for clarity. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present It will be further understood that the terms "first," "second," "third," etc. are used herein to distinguish one element from another, and the elements are not limited by these terms. Thus, a "first" transistor or node in an exemplary embodiment may be described as a "second" transistor or node in another exemplary embodiment.

FIG. 1 is a circuit diagram illustrating a conventional level shifting circuit. Referring to FIG. 1, a level shifting circuit 10 may include p-type (PMOS) transistors PM1, PM2, PM3, and PM4, and n-type (NMOS) transistors NM1 and NM2. The types of transistors shown in FIG. 1 are exemplary. Exemplary embodiments of the inventive concept are not limited to the types of transistors shown in FIG. 1. The level shifting circuit 10 may amplify a voltage level of an input signal Vin to output an output signal Vout.

In FIG. 1, one end of each of the N-type transistors NM1 and NM2 is connected to a ground terminal. The input signal Vin in inputted to a gate terminal of the first NMOS transistor NM1. An inverted input signal Vinb is inputted to a gate terminal of the second NMOS transistor NM2. An inverter INV inverts the input signal Vin to generate the inverted input signal Vinb. The inverter INV may be driven with a drive low voltage VDDL. The other end of the first NMOS transistor NM1 is connected to a first node N1. The other end of the second NMOS transistor NM2 is connected to a node at which the output signal Vout is output. Herein, the node at which the output signal Vout is output may be referred to as an output node.

One end of each of the first and second PMOS transistors PM1 and PM2 is connected to a node at which a drive high voltage VDDH is applied. Herein, referring to FIGS. 1 to 11, the node at which the drive high voltage VDDH is applied may be referred to as a drive high voltage node. A gate terminal of the first PMOS transistor PM1 is connected to the node at which the output signal Vout is applied. The other end of the first PMOS transistor PM1 is connected to a third node N3. A gate terminal of the second PMOS transistor PM2 is connected to the first node N1. The other end of the second PMOS transistor PM2 is connected to a second node N2. One end of the third PMOS transistor PM3 is connected to the third node N3. The other end of the third PMOS transistor PM3 is connected to the first node N1. A gate terminal of the third PMOS transistor PM3 is connected to a node at which the input signal Vin is applied. One end of the fourth PMOS transistor PM4 is connected to the second node N2. The other end of the fourth PMOS transistor PM4 is connected to the node at which the output signal Vout is applied. A gate terminal of the fourth PMOS transistor PM4 is connected to a node at which the inverted input signal Vinb is applied.

The level shifting circuit 10 may amplify a voltage level of the input signal Vin to output the output signal Vout. For example, when the input signal Vin is in a high level, the first NMOS transistor NM1 is turned on, and the third PMOS transistor PM3 is turned off. Thus, a voltage level of the first node N1 is maintained at a low level. When the inverted input signal Vinb is in a low level (e.g., when the input signal Vin is in a high level), the second NMOS transistor NM2 is turned off, and the fourth PMOS transistor PM4 is turned on. At this time, a voltage level of the first node N1 is a low level through the first NMOS transistor NM1, and the second PMOS transistor PM2 is turned on. The output signal Vout transitions to a high level through the second and fourth PMOS transistor PM2 and PM4, and the first PMOS transistor PM1 is turned off. Accordingly, a voltage level of the output signal Vout may be changed to a level higher than a voltage level of the input signal Vin by the drive high voltage VDDH. The drive high voltage VDDH has a voltage level higher than the drive low voltage VDDL.

The level shifting circuit 10 may receive the input signal Vin of a low level and output the output signal Vout of a low level. For example, when the input signal Vin is in a low level, the first NMOS transistor NM1 is turned off, and the third PMOS transistor PM3 is turned on. When the inverted input signal Vinb is in a high level (e.g., when the input signal Vin is in a low level), the second NMOS transistor NM2 is turned on, and the fourth PMOS transistor PM4 is turned off. At this time, the output signal Vout transitions to a low level through the second NMOS transistor NM2, and the first PMOS transistor PM1 is turned on. A voltage level of the first node N1 is the high level through the first and third PMOS transistors PM1 and PM3, and the second PMOS transistor PM2 is turned off. Accordingly, the output signal Vout may be maintained at a low level.

However, when a difference between the drive low voltage VDDL and the drive high voltage VDDH increases, the level shifting circuit 10 may operate abnormally. For example, in this case, the above-described transistors NM1, NM2, and PM1 to PM4 may not be instantaneously turned on or off. When a voltage applied to a gate terminal increases to be higher than a threshold voltage, the NMOS transistors NM1 and NM2 may gradually be opened, and the amount of current flowing in each of the NMOS transistors NM1 and NM2 may gradually increase. Moreover, when a voltage applied to a gate terminal decreases to be lower than the threshold voltage, the PMOS transistors PM1 to PM4 may gradually be opened, and the amount of current flowing in each of the PMOS transistors PM1 to PM4 may gradually increase.

Alternatively, when a voltage applied to a gate terminal decreases to be lower than the threshold voltage, the NMOS transistors NM1 and NM2 may gradually be closed, and the amount of current flowing in each of the NMOS transistors NM1 and NM2 may gradually decrease. Moreover, when a voltage applied to a gate terminal increases to be higher than the threshold voltage, the PMOS transistors PM1 to PM4 may gradually be closed, and the amount of current flowing in each of the PMOS transistors PM1 to PM4 may gradually decrease.

Moreover, when the amount of current flowing in each transistor increases, the channel of each transistor may be strongly opened. Thus it may be difficult to close the channel of each transistor.

That is, when a difference between the drive low voltage VDDL and the drive high voltage VDDH increases, the amount of current flowing in each of the PMOS transistors PM1 to PM4 may increase. When a current flowing in each of the PMOS transistors PM1 to PM4 increases, the PMOS transistors PM1 to PM4 may not be closed. When each of the PMOS transistors PM1 to PM4 is not turned off at a specific timing, a level of the output signal Vout may not be transitioned. Accordingly, to achieve efficient operation, a current flowing in each of the PMOS transistors PM1 to PM4 should be adjusted.

Figure 2:
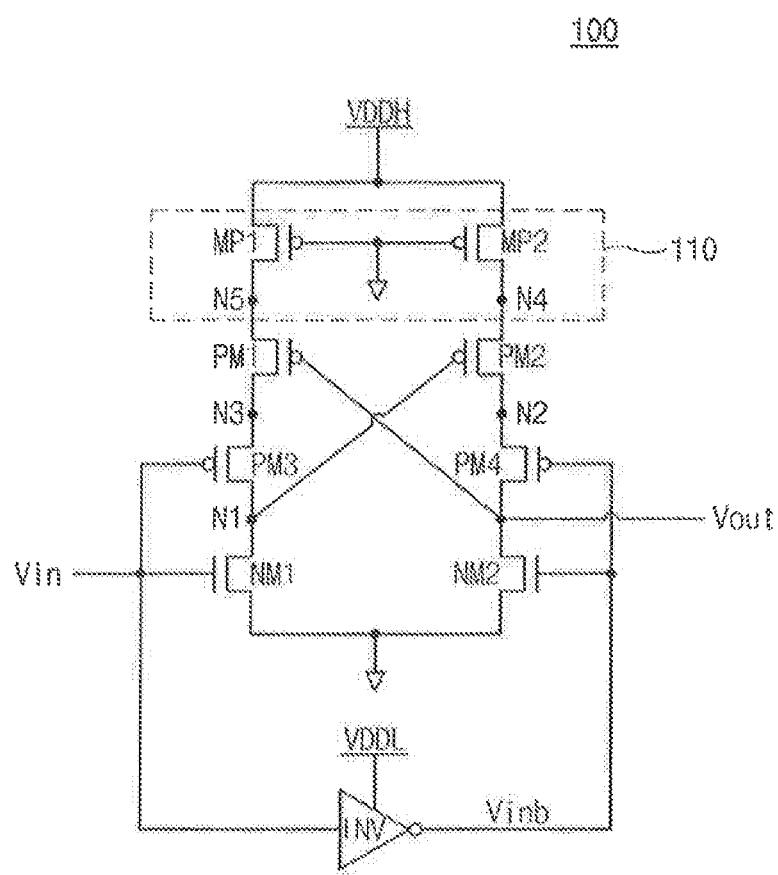
FIG. 2 is a circuit diagram illustrating a level shifting circuit according to an exemplary embodiment of the inventive concept.

FIG. 2 is a circuit diagram illustrating a level shifting circuit 100 according to an exemplary embodiment of the inventive concept. Referring to FIG. 2, in an exemplary embodiment, a level shifting circuit 100 includes p-type (PMOS) transistors PM1 to PM4, MP1 and MP2, and n-type (NMOS) transistors NM1 and NM2. The types of transistors shown in FIG. 2 are exemplary. Exemplary embodiments of the inventive concept are not limited to the types of transistors shown in FIG. 2. The level shifting circuit 100 amplifies a voltage level of the input signal Vin to output the output signal Vout. A level shifting operation of the level shifting circuit 100 may be the same as or similar to a level shifting operation of the level shifting circuit 10 illustrated in FIG. 1. Accordingly, a further description thereof, and a further description of elements previously described, may be omitted herein.

In the exemplary embodiment shown in FIG. 2, the level shifting circuit 100 includes a current adjustment circuit 110. Herein, referring to FIGS. 2 to 11, a portion of the level shifting circuit other than the current adjustment circuit may be referred to as a level shifting portion of the level shifting circuit. The current adjustment circuit 110 includes, for example, first and second current adjustment transistors MP1 and MP2. One end of each of the first and second current adjustment transistors MP1 and MP2 is connected to a node at which the drive high voltage VDDH is applied. A gate terminal of each of the first and second current adjustment transistors MP1 and MP2 is connected to a ground terminal. The other end of the first current adjustment transistor MP1 is connected to a fifth node N5. The other end of the second current adjustment transistor MP2 is connected to a fourth node N4. The first and second current adjustment transistors MP1 and MP2 are turned on regardless of the input signal Vin. Herein, when a transistor is referred to as being turned on regardless of a certain signal, it is understood that the certain signal has no effect on the transistor in regards to the transistor turning on. Further, when a transistor is referred to as being turned on according to a certain signal or according to a voltage at a certain node, it is understood that the transistor is affected by the certain signal or the voltage at the certain node. For example, the transistor may be turned on in response to the certain signal or the voltage at the certain node having a certain value.

One end of the first PMOS transistor PM1 is connected to the fifth node N5. The other end of the first PMOS transistor PM1 is connected to a third node N3. A gate terminal of the first PMOS transistor PM1 is connected to a node at which the output signal Vout is applied. One end of the second PMOS transistor PM2 is connected to the fourth node N4. The other end of the second PMOS transistor PM2 is connected to a second node N2. A gate terminal of the second PMOS transistor PM2 is connected to a first node N1.

In the exemplary embodiment of FIG. 2, the first and third PMOS transistors PM1 and PM3 are serially connected to the first current adjustment transistor MP1, and the first and third PMOS transistors PM1 and PM3 and the first current adjustment transistor MP1 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second and fourth PMOS transistors PM2 and PM4 are serially connected to the second current adjustment transistor MP2, and the second and fourth PMOS transistors PM2 and PM4 and the second current adjustment transistor MP2 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 110 is connected to the ground terminal, the PMOS transistors included in the current adjustment circuit 110 are always turned on (e.g., regardless of the input signal Vin).

The level shifting circuit 100 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 100 may be prevented.

Figure 3:
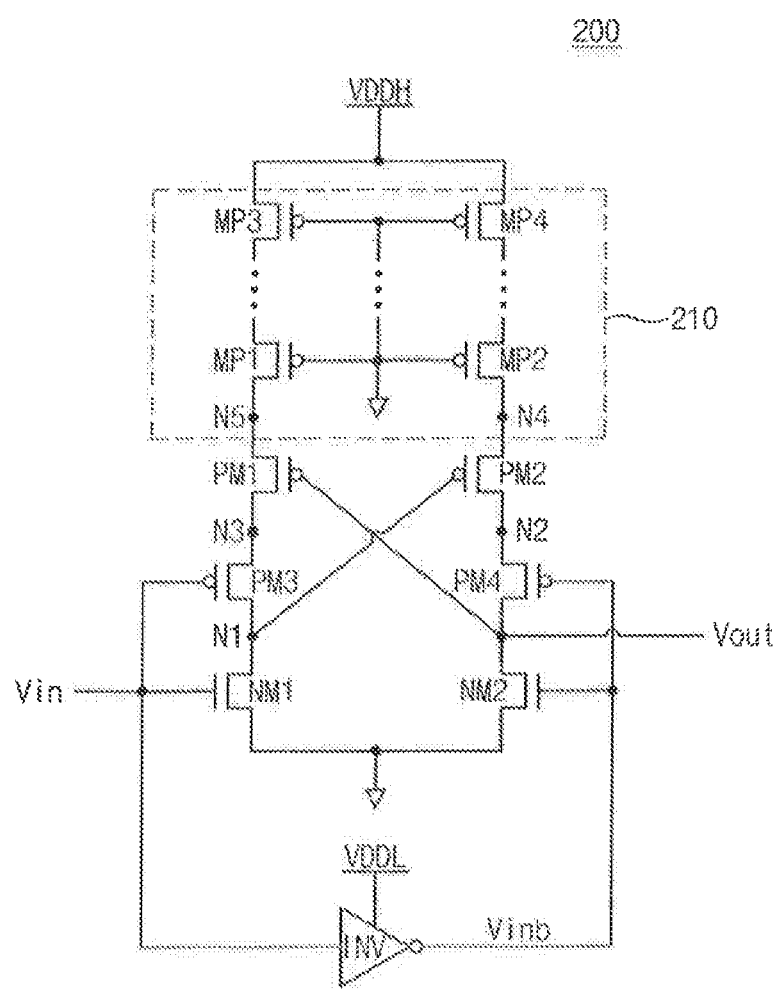
FIG. 3 is a circuit diagram illustrating a level shifting circuit according to an exemplary embodiment of the inventive concept.

FIG. 3 is a circuit diagram illustrating a level shifting circuit 200 according to an exemplary embodiment of the inventive concept. Referring to FIG. 3, in an exemplary embodiment, a level shifting circuit 200 includes p-type (PMOS) transistors PM1 to PM4, and MP1 to MP4, and n-type (NMOS) transistors NM1 and NM2. The types of transistors shown in FIG. 3 are exemplary. Exemplary embodiments of the inventive concept are not limited thereto. The level shifting circuit 200 amplifies a voltage level of the input signal Vin to output the output signal Vout. A level shifting operation of the level shifting circuit 200 may be the same as or similar to a level shifting operation of the level shifting circuit 10 illustrated in FIG. 1. Accordingly, a further description thereof, and a further description of elements previously described, may be omitted herein.

In the exemplary embodiment shown in FIG. 3, the level shifting circuit 200 includes a current adjustment circuit 210. The current adjustment circuit 210 includes, for example, first to fourth current adjustment transistors MP1 to MP4. One end of each of the third and fourth current adjustment transistors MP3 and MP4 is connected to a node at which the drive high voltage VDDH is applied. One end of the first current adjustment transistor MP1 is connected to a fifth node N5. One end of the second current adjustment transistor MP2 is connected to a fourth node N4. At least one PMOS transistor may be serially connected between the first current adjustment transistor MP1 and the third current adjustment transistor MP3, forming a plurality of PMOS transistors. At least one PMOS transistor may be serially connected between the second current adjustment transistor MP2 and the fourth current adjustment transistor MP4, forming a plurality of PMOS transistors. A gate terminal of each of the PMOS transistors included in the current adjustment circuit 210 is connected to a ground terminal.

One end of the first PMOS transistor PM1 is connected to the fifth node N5. The other end of the first PMOS transistor PM1 is connected to a third node N3. A gate terminal of the first PMOS transistor PM1 is connected to a node at which the output signal Vout is applied. One end of the second PMOS transistor PM2 is connected to the fourth node N4. The other end of the second PMOS transistor PM2 is connected to a second node N2. A gate terminal of the second PMOS transistor PM2 is connected to a first node N1.

The first and third PMOS transistors PM1 and PM3 are serially connected to the PMOS transistors MP1 to MP3, and the first and third PMOS transistors PM1 and PM3 and the PMOS transistors MP1 to MP3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second and fourth PMOS transistors PM2 and PM4 are serially connected to the PMOS transistors MP2 to MP4, and the second and fourth PMOS transistors PM2 and PM4 and the PMOS transistors MP2 to MP4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 210 is connected to the ground terminal, the PMOS transistors included in the current adjustment circuit 210 are always turned on (e.g., regardless of the input signal Vin).

The level shifting circuit 200 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 200 may be prevented.

Figure 4:
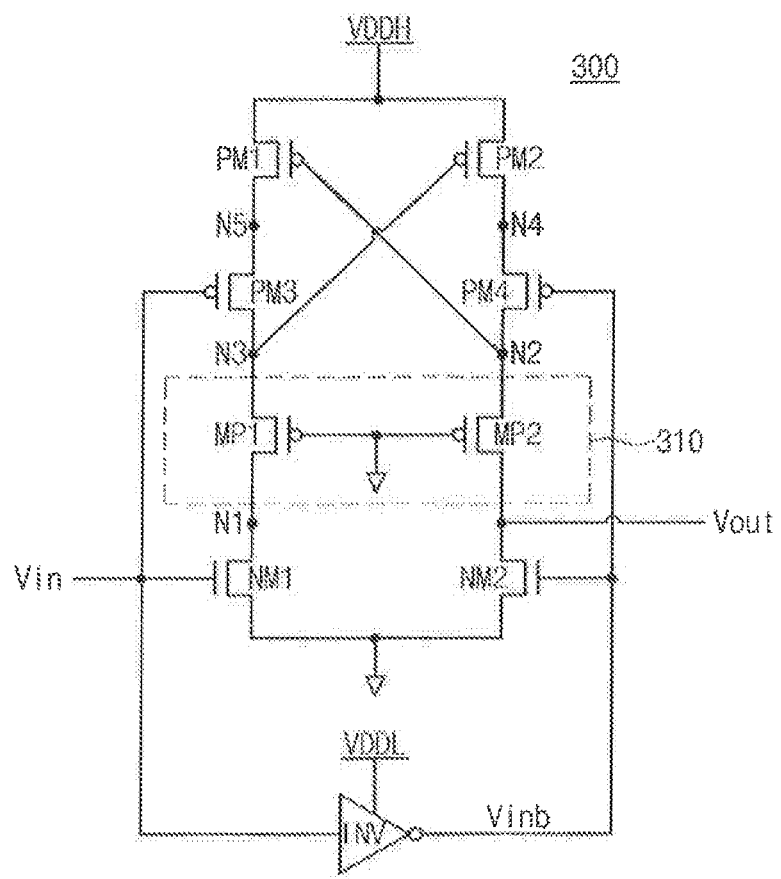
FIGS. 4 to 11 are circuit diagrams illustrating a level shifting circuit according to exemplary embodiments of the inventive concept.

FIG. 4 is a circuit diagram illustrating a level shifting circuit 300 according to an exemplary embodiment of the inventive concept. Referring to FIG. 4, in an exemplary embodiment, a level shifting circuit 300 includes p-type (PMOS) transistors PM1 to PM4, MP1 and MP2, and n-type (NMOS) transistors NM1 and NM2. The types of transistors shown in FIG. 4 are exemplary. Exemplary embodiments of the inventive concept are not limited thereto. The level shifting circuit 300 amplifies a voltage level of the input signal Vin to output the output signal Vout. A level shifting operation of the level shifting circuit 300 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. The other end of the first PMOS transistor PM1 is connected to a fifth node N5. A gate terminal of the first PMOS transistor PM1 is connected to a second node N2. The other end of the second PMOS transistor PM2 is connected to a fourth node N4. A gate terminal of the second PMOS transistor PM2 is connected to a third node N3.

The level shifting circuit 300 includes a current adjustment circuit 310. The current adjustment circuit 310 includes, for example, first and second current adjustment transistors MP1 and MP2. One end of the first current adjustment transistor MP1 is connected to the third node N3. One end of the second current adjustment transistor MP2 is connected to the second node N2. A gate terminal of each of the first and second current adjustment transistors MP1 and MP2 is connected to a ground terminal. The other end of the first current adjustment transistor MP1 is connected to a first node N1. The other end of the second current adjustment transistor MP2 is connected to a node at which the output signal Vout is applied.

The first current adjustment transistor MP1 is serially connected to the first and third PMOS transistors PM1 and PM3, and the first current adjustment transistor MP1 and the first and third PMOS transistors PM1 and PM3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second current adjustment transistor MP2 is serially connected to the second and fourth PMOS transistors PM2 and PM4, and the second current adjustment transistor MP2 and the second and fourth PMOS transistors PM2 and PM4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 310 is connected to the ground terminal, the PMOS transistors included in the current adjustment circuit 310 are always turned on (e.g., regardless of the input signal Vin).

The level shifting circuit 300 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 300 may be prevented.

Figure 5:
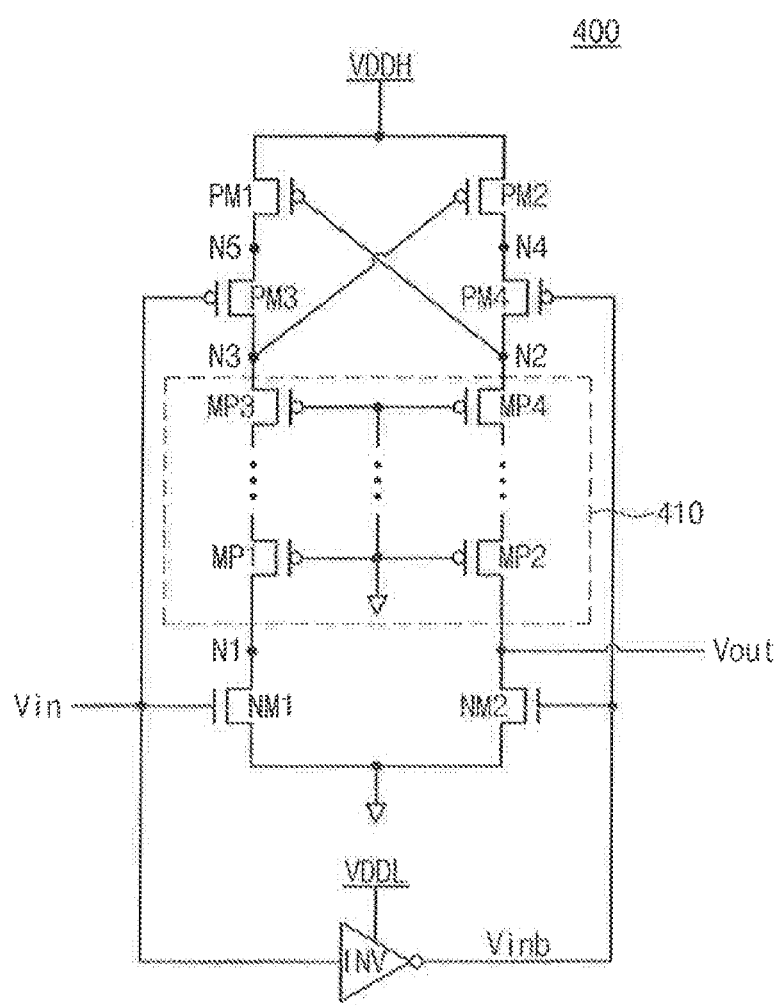

FIG. 5 is a circuit diagram illustrating a level shifting circuit 400 according to an exemplary embodiment of the inventive concept. Referring to FIG. 5, a level shifting circuit 400 includes p-type (PMOS) transistors PM1 to PM4, and MP1 to MP4, and n-type (NMOS) transistors NM1 and NM2. The types of transistors shown in FIG. 5 are exemplary. Exemplary embodiments of the inventive concept are not limited thereto. The level shifting circuit 400 amplifies a voltage level of the input signal Vin to output the output signal Vout. A level shifting operation of the level shifting circuit 400 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. A gate terminal of the first PMOS transistor PM1 is connected to a second node N2. The other end of the first PMOS transistor PM1 is connected to a fifth node N5. A gate terminal of the second PMOS transistor PM2 is connected to a third node N3. The other end of the second PMOS transistor PM2 is connected to a fourth node N4.

The level shifting circuit 400 includes a current adjustment circuit 410. The current adjustment circuit 410 includes, for example, first to fourth current adjustment transistors MP1 to MP4. One end of the third current adjustment transistor MP3 is connected to the third node N3. One end of the fourth current adjustment transistor MP4 is connected to the second node N2. One end of the first current adjustment transistor MP1 is connected to a first node N1. One end of the second current adjustment transistor MP2 is connected to a node at which the output signal Vout is applied. At least one PMOS transistor may be serially connected between the third current adjustment transistor MP3 and the first current adjustment transistor MP1, forming a plurality of PMOS transistors. At least one PMOS transistor may be serially connected between the fourth current adjustment transistor MP4 and the second current adjustment transistor MP2, forming a plurality of PMOS transistors. A gate terminal of each of the PMOS transistors included in the current adjustment circuit 410 is connected to a ground terminal.

The first and third PMOS transistors PM1 and PM3 are serially connected to the PMOS transistors MP1 to MP3, and the first and third PMOS transistors PM1 and PM3 and the PMOS transistors MP1 to MP3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second and fourth PMOS transistors PM2 and PM4 are serially connected to the PMOS transistors MP2 to MP4, and the second and fourth PMOS transistors PM2 and PM4 and the PMOS transistors MP2 to MP4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 410 is connected to the ground terminal, the PMOS transistors included in the current adjustment circuit 410 are always turned on (e.g., regardless of the input signal Vin).

The level shifting circuit 400 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 400 may be prevented.

Figure 6:
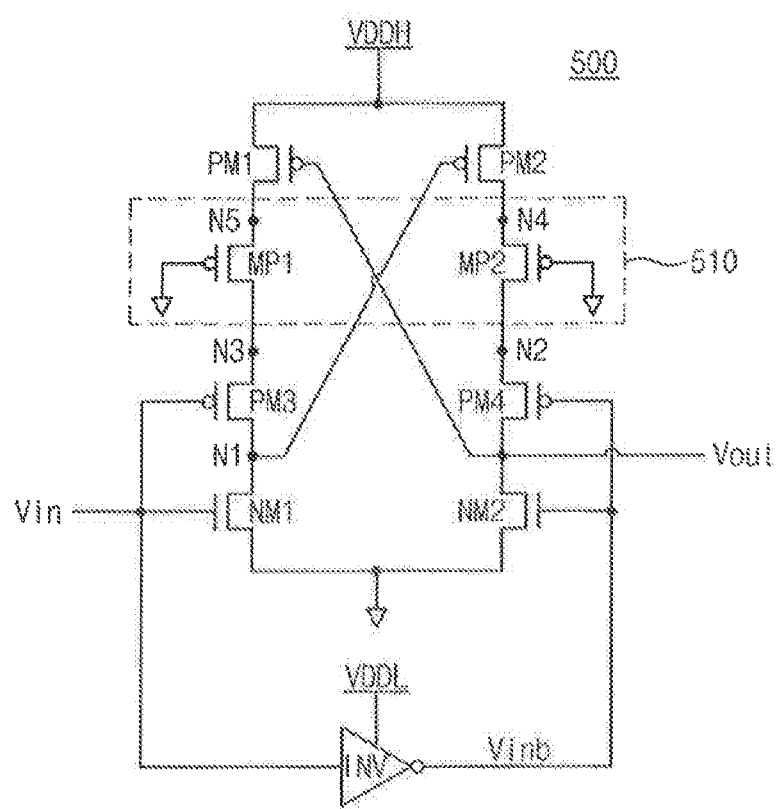

FIG. 6 is a circuit diagram illustrating a level shifting circuit 500 according an exemplary embodiment of the inventive concept. Referring to FIG. 6, a level shifting circuit 500 includes p-type (PMOS) transistors PM1 to PM4, MP1, and MP2, and n-type (NMOS) transistors NM1 and NM2. The types of transistors shown in FIG. 6 are exemplary. Exemplary embodiments of the inventive concept are not limited thereto. The level shifting circuit 500 amplifies a voltage level of the input signal Vin to output the output signal Vout. A level shifting operation of the level shifting circuit 500 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. The other end of the first PMOS transistor PM1 is connected to a fifth node N5. A gate terminal of the first PMOS transistor PM1 is connected to a node at which the output signal Vout is applied. The other end of the second PMOS transistor PM2 is connected to a fourth node N4. A gate terminal of the second PMOS transistor PM2 is connected to a first node N1.

The level shifting circuit 500 includes a current adjustment circuit 510. The current adjustment circuit 510 includes, for example, first and second current adjustment transistors MP1 and MP2. One end of the first current adjustment transistor MP1 is connected to the fifth node N5. One end of the second current adjustment transistor MP2 is connected to the fourth node N4. A gate terminal of each of the first and second current adjustment transistors MP1 and MP2 is connected to a ground terminal. The other end of the first current adjustment transistor MP1 is connected to a third node N3. The other end of the second current adjustment transistor MP2 is connected to a second node N2.

The first current adjustment transistor MP1 is connected between the first and third PMOS transistors PM1 and PM3. The first PMOS transistor PM1, the first current adjustment transistor MP1, and the third PMOS transistor PM3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second current adjustment transistor MP2 is connected between the second and fourth PMOS transistors PM2 and PM4. The second PMOS transistor PM2, the second current adjustment transistor MP2, and the fourth PMOS transistor PM4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 510 is connected to the ground terminal, the PMOS transistors included in the current adjustment circuit 510 are always turned on (e.g., regardless of the input signal Vin).

The level shifting circuit 500 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 500 may be prevented.

Figure 7:
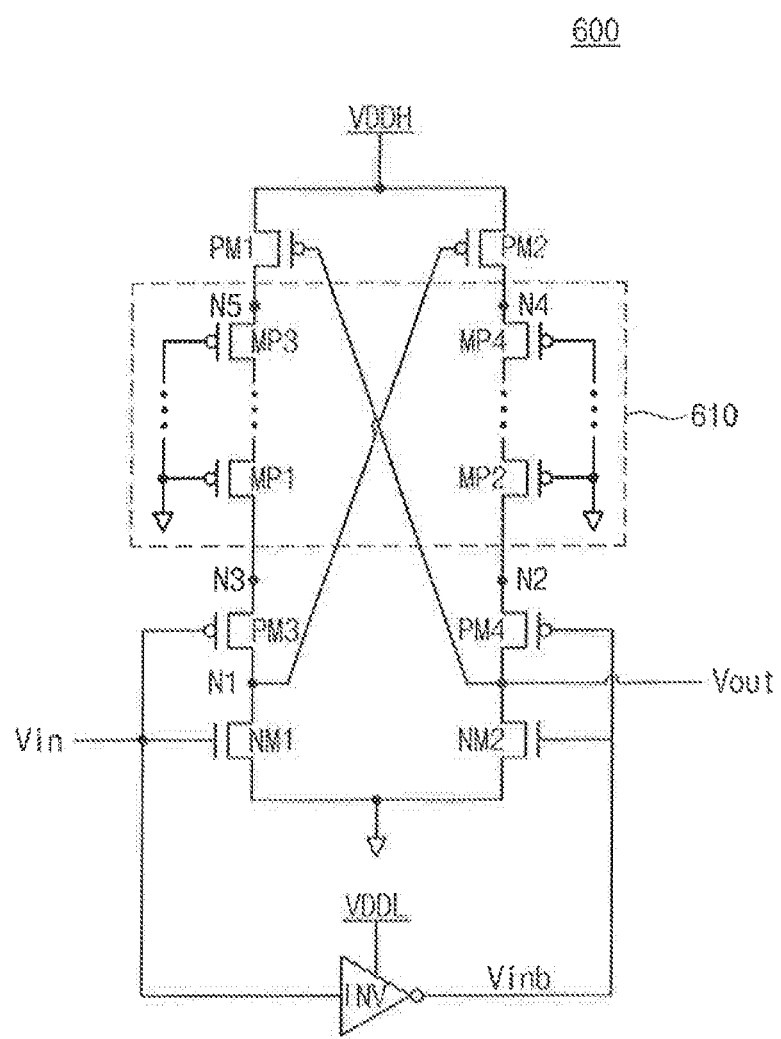

FIG. 7 is a circuit diagram illustrating a level shifting circuit 600 according to an exemplary embodiment of the inventive concept. Referring to FIG. 7, a level shifting circuit 600 includes p-type (PMOS) transistors PM1 to PM4, and MP1 to MP4, and n-type (NMOS) transistors NM1 and NM2. The types of transistors shown in FIG. 7 are exemplary. Exemplary embodiments of the inventive concept are not limited thereto. The level shifting circuit 600 amplifies a voltage level of the input signal Vin to output the output signal Vout. A level shifting operation of the level shifting circuit 600 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. A gate terminal of the first PMOS transistor PM1 is connected to a node at which the output signal Vout is applied. The other end of the first PMOS transistor PM1 is connected to a fifth node N5. A gate terminal of the second PMOS transistor PM2 is connected to a first node N1. The other end of the second PMOS transistor PM2 is connected to a fourth node N4.

The level shifting circuit 600 includes a current adjustment circuit 610. The current adjustment circuit 610 includes, for example, first to fourth current adjustment transistors MP1 to MP4. One end of the third current adjustment transistor MP3 is connected to the fifth node N5. One end of the fourth current adjustment transistor MP4 is connected to the fourth node N4. One end of the first current adjustment transistor MP1 is connected to a third node N3. One end of the second current adjustment transistor MP2 is connected to a second node N2. At least one PMOS transistor may be serially connected between the first current adjustment transistor MP1 and the third current adjustment transistor MP3, forming a plurality of PMOS transistors. At least one PMOS transistor may be serially connected between the second current adjustment transistor MP2 and the fourth current adjustment transistor MP4, forming a plurality of PMOS transistors. A gate terminal of each of the PMOS transistors included in the current adjustment circuit 610 is connected to a ground terminal.

The PMOS transistors MP1 to MP3 are serially connected between the first and third PMOS transistors PM1 and PM3. The first PMOS transistor PM1, the PMOS transistors MP1 to MP3, and the third PMOS transistor PM3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The PMOS transistors MP2 to MP4 are serially connected between the second and fourth PMOS transistors PM2 and PM4. The second PMOS transistor PM2, the PMOS transistors MP2 to MP4, and the fourth PMOS transistor PM4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied. According to exemplary embodiments, because a gate terminal of each of the PMOS transistors included in the current adjustment circuit 610 is connected to the ground terminal, the PMOS transistors included in the current adjustment circuit 610 are always turned on (e.g., regardless of the input signal Vin).

The level shifting circuit 600 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 600 may be prevented.

Figure 8:
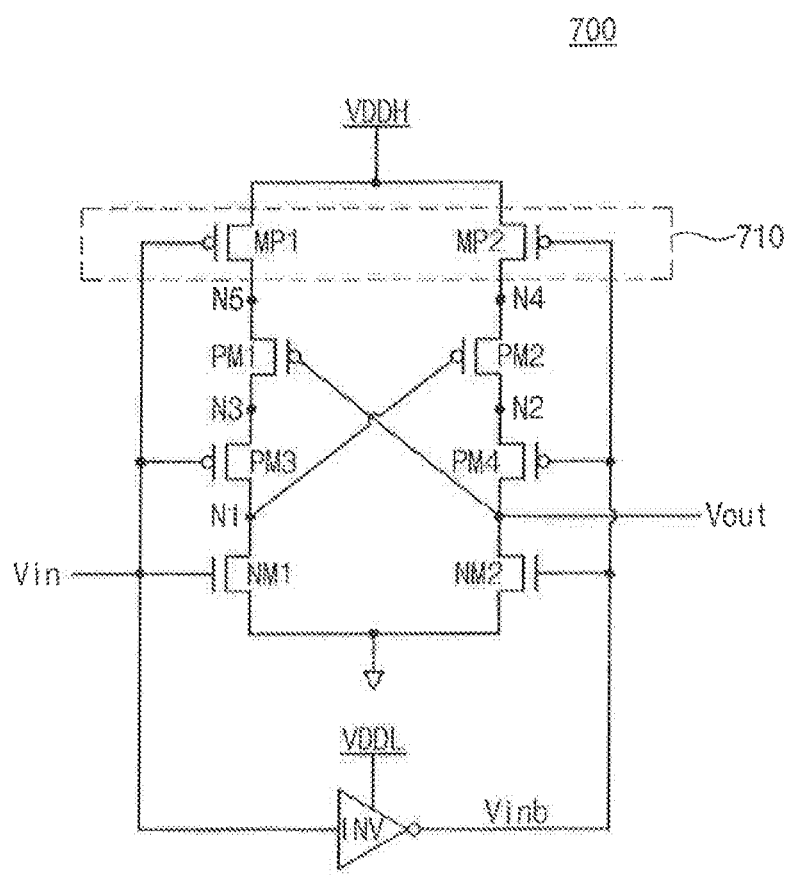

FIG. 8 is a circuit diagram illustrating a level shifting circuit 700 according to an exemplary embodiment of the inventive concept. Referring to FIG. 8, a level shifting circuit 700 includes p-type (PMOS) transistors PM1 to PM4, MP1, and MP2, and n-type (NMOS) transistors NM1 and NM2. The types of transistors are exemplary. Exemplary embodiments of the inventive concept are not limited thereto. The level shifting circuit 700 amplifies a voltage level of the input signal Vin to output the output signal Vout. A level shifting operation of the level shifting circuit 700 may be the same as or similar to a level shifting operation of the level shifting circuit 10 illustrated in FIG. 1. Accordingly, a further description thereof, and a further description of elements previously described, may be omitted herein.

The level shifting circuit 700 includes a current adjustment circuit 710. The current adjustment circuit 710 includes, for example, first and second current adjustment transistors MP1 and MP2. One end of each of the first and second current adjustment transistors MP1 and MP2 is connected to a node at which the drive high voltage VDDH is applied. A gate terminal of the first current adjustment transistor MP1 is connected to a node at which the input signal Vin is applied. The other end of the first current adjustment transistor MP1 is connected to a fifth node N5. A gate terminal of the second current adjustment transistor MP2 is connected to a node at which the inverted input signal Vinb is applied. The other end of the second current adjustment transistor MP2 is connected to a fourth node N4.

One end of the first PMOS transistor PM1 is connected to the fifth node N5. The other end of the first PMOS transistor PM1 is connected to a third node N3. A gate terminal of the first PMOS transistor PM1 is connected to a node at which the output signal Vout is applied. One end of the second PMOS transistor PM2 is connected to the fourth node N4. The other end of the second PMOS transistor PM2 is connected to a second node N2. A gate terminal of the second PMOS transistor PM2 is connected to the first node N1.

One end of the third PMOS transistor PM3 is connected to the third node N3. A gate terminal of the third PMOS transistor PM3 is connected to the node at which the input signal Vin is applied. The other end of the third PMOS transistor PM3 is connected to the first node N1. One end of the fourth PMOS transistor PM4 is connected to the second node N2. A gate terminal of the fourth PMOS transistor PM4 is connected to the node at which the inverted input signal Vinb is applied. The other end of the fourth PMOS transistor PM4 is connected to the node at which the output signal Vout is applied.

The first and third PMOS transistors PM1 and PM3 are serially connected to the first current adjustment transistor MP1. The first and third PMOS transistors PM1 and PM3 and the first current adjustment transistor MP1 are serially connected between the node at which the drive high voltage VDDH is applied and a first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second and fourth PMOS transistors PM2 and PM4 are serially connected to the second current adjustment transistor MP2. The second and fourth PMOS transistors PM2 and PM4 and the second current adjustment transistor MP2 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied.

The current adjustment transistors included in the current adjustment circuit 710 may be turned on or off according to the input signal Vin. For example, when the input signal Vin is in a low level, the first current adjustment transistor MP1 may be turned on, and the second current adjustment transistor MP2 may be turned off. When the input signal Vin is in a high level, the first current adjustment transistor MP1 may be turned off, and the second current adjustment transistor MP2 may be turned on. Accordingly, power consumption of the current adjustment transistors included in the current adjustment circuit 710 may be less than it would be compared to a circuit in which the current adjustment transistors are always turned on.

The level shifting circuit 700 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 700 may be prevented.

Figure 9:
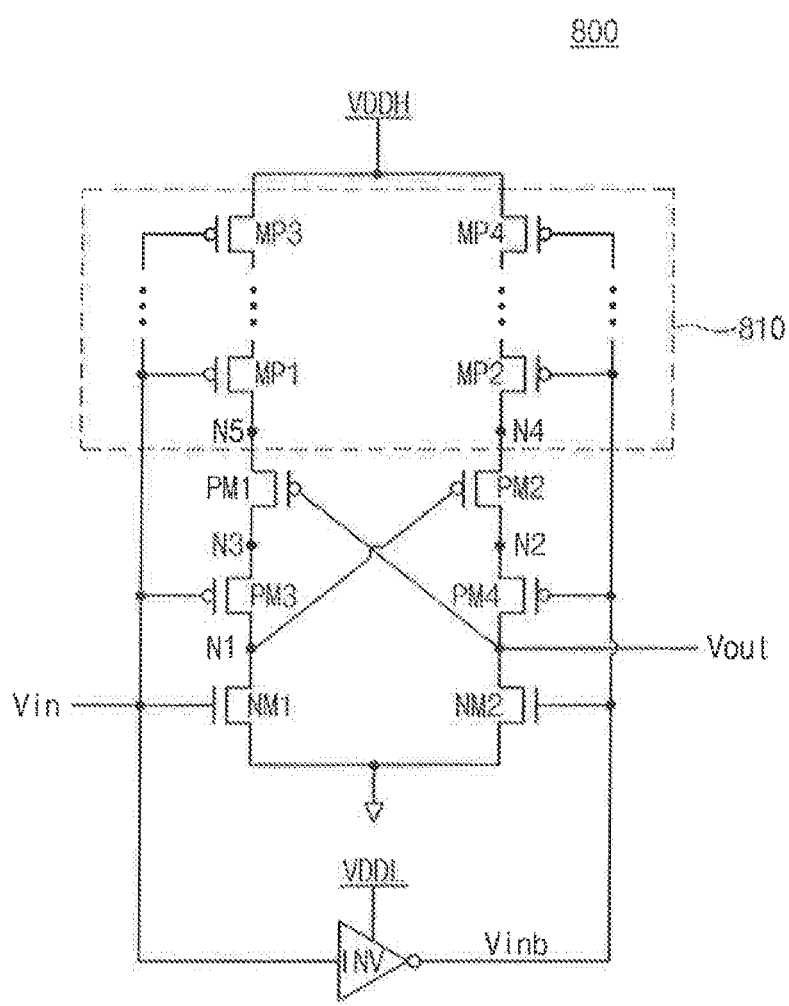

FIG. 9 is a circuit diagram illustrating a level shifting circuit 800 according to an exemplary embodiment of the inventive concept. Referring to FIG. 9, a level shifting circuit 800 includes p-type (PMOS) transistors PM1 to PM4, and MP1 to MP4, and n-type (NMOS) transistors NM1 and NM2. The types of transistors shown in FIG. 9 are exemplary. Exemplary embodiments of the inventive concept are not limited thereto. The level shifting circuit 800 amplifies a voltage level of the input signal Vin to output the output signal Vout. A level shifting operation of the level shifting circuit 800 may be the same as or similar to a level shifting operation of the level shifting circuit 10 illustrated in FIG. 1. Accordingly, a further description thereof, and a further description of elements previously described, may be omitted herein.

The level shifting circuit 800 includes a current adjustment circuit 810. The current adjustment circuit 810 includes, for example, first to fourth current adjustment transistors MP1 to MP4. One end of each of the third and fourth current adjustment transistors MP3 and MP4 is connected to a node at which the drive high voltage VDDH is applied. One end of the first current adjustment transistor MP1 is connected to a fifth node N5. One end of the second current adjustment transistor MP2 is connected to a fourth node N4. At least one PMOS transistor may be serially connected between the first current adjustment transistor MP1 and the third current adjustment transistor MP3, forming a plurality of PMOS transistors. At least one PMOS transistor may be serially connected between the second current adjustment transistor MP2 and the fourth current adjustment transistor MP4, forming a plurality of PMOS transistors. A gate terminal of each of the first and third current adjustment transistors MP1 and MP3 is connected to a node at which the input signal Vin is applied. A gate terminal of each of the second and fourth current adjustment transistors MP2 and MP4 is connected to a node at which the inverted input signal Vinb is applied.

One end of the first PMOS transistor PM1 is connected to the fifth node N5. The other end of the first PMOS transistor PM1 is connected to a third node N3. A gate terminal of the first PMOS transistor PM1 is connected to a node at which the output signal Vout is applied. One end of the second PMOS transistor PM2 is connected to the fourth node N4. The other end of the second PMOS transistor PM2 is connected to a second node N2. A gate terminal of the second PMOS transistor PM2 is connected to the first node N1.

One end of the third PMOS transistor PM3 is connected to the third node N3. A gate terminal of the third PMOS transistor PM3 is connected to the node at which the input signal Vin is applied. The other end of the third PMOS transistor PM3 is connected to a first node N1. One end of the fourth PMOS transistor PM4 is connected to the second node N2. A gate terminal of the fourth PMOS transistor PM4 is connected to the node at which the inverted input signal Vinb is applied. The other end of the fourth PMOS transistor PM4 is connected to the node at which the output signal Vout is applied.

The first and third PMOS transistors PM1 and PM3 are serially connected to the PMOS transistors MP1 to MP3. The first and third PMOS transistors PM1 and PM3 and the PMOS transistors MP1 to MP3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second and fourth PMOS transistors PM2 and PM4 are serially connected to the PMOS transistors MP2 to MP4. The second and fourth PMOS transistors PM2 and PM4 and the PMOS transistors MP2 to MP4 are serially connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied.

The PMOS transistors included in the current adjustment circuit 810 may be turned on or off according to the input signal Vin. For example, when the input signal Vin is in a low level, transistors between the first and third current adjustment transistors MP1 and MP3 may be turned on, and transistors between the second and fourth current adjustment transistors MP2 and MP4 may be turned off. For example, when the input signal Vin is in a high level, transistors between the first and third current adjustment transistors MP1 and MP3 may be turned off, and transistors between the second and fourth current adjustment transistors MP2 and MP4 may be turned on. Accordingly, power consumption of the current adjustment transistors included in the current adjustment circuit 810 may be less than it would be compared to a circuit in which the current adjustment transistors are always turned on.

The level shifting circuit 800 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 800 may be prevented.

Figure 10:
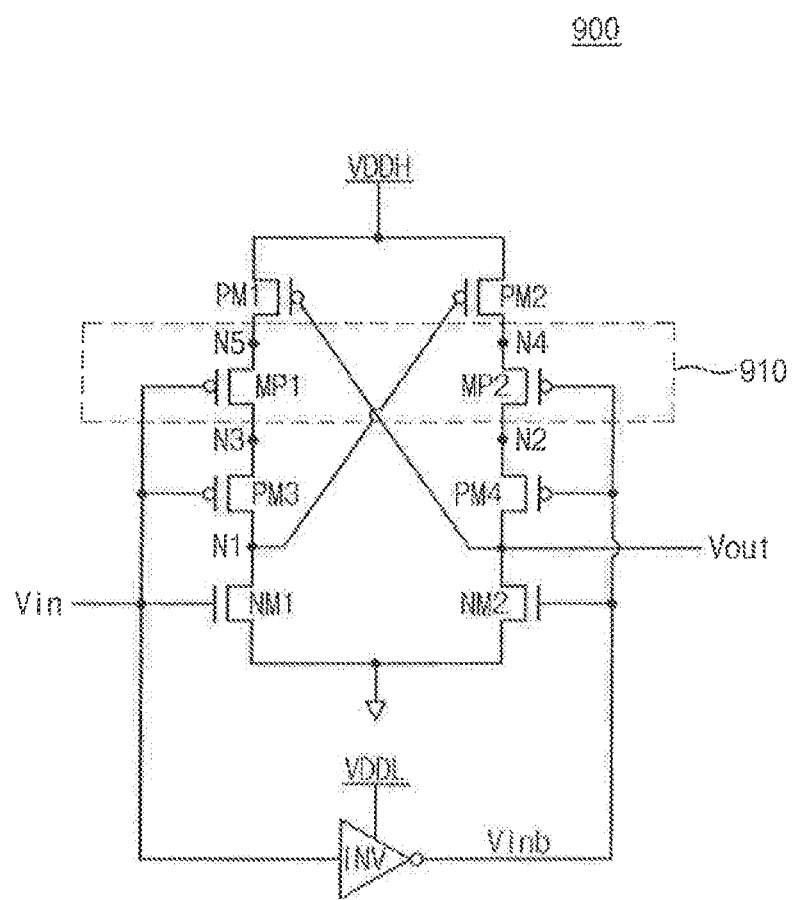

FIG. 10 is a circuit diagram illustrating a level shifting circuit 900 according to an exemplary embodiment of the inventive concept. Referring to FIG. 10, a level shifting circuit 900 includes p-type (PMOS) transistors PM1 to PM4, MP1, and MP2, and n-type (NMOS) transistors NM1 and NM2. The types of transistors are exemplary. Exemplary embodiments of the inventive concept are not limited thereto. The level shifting circuit 900 amplifies a voltage level of the input signal Vin to output the output signal Vout. A level shifting operation of the level shifting circuit 900 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. The other end of the first PMOS transistor PM1 is connected to a fifth node N5. A gate terminal of the first PMOS transistor PM1 is connected to a node at which the output signal Vout is applied. The other end of the second PMOS transistor PM2 is connected to a fourth node N4. A gate terminal of the second PMOS transistor PM2 is connected to a first node N1.

One end of the third PMOS transistor PM3 is connected to a third node N3. A gate terminal of the third PMOS transistor PM3 is connected to a node at which the input signal Vin is applied. The other end of the third PMOS transistor PM3 is connected to the first node N1. One end of the fourth PMOS transistor PM4 is connected to a second node N2. A gate terminal of the fourth PMOS transistor PM4 is connected to a node at which the inverted input signal Vinb is applied. The other end of the fourth PMOS transistor PM4 is connected to the node at which the output signal Vout is applied.

The level shifting circuit 900 includes a current adjustment circuit 910. The current adjustment circuit 910 includes, for example, first and second current adjustment transistors MP1 and MP2. One end of the first current adjustment transistor MP1 is connected to the fifth node N5. The other end of the first current adjustment transistor MP1 is connected to the third node N3. One end of the second current adjustment transistor MP2 is connected to the fourth node N4. The other end of the second current adjustment transistor MP2 is connected to the second node N2. A gate terminal of the first current adjustment transistor MP1 is connected to the node at which the input signal Vin is applied. A gate terminal of the second current adjustment transistor MP2 is connected to the node at which the inverted input signal Vinb is applied.

The first current adjustment transistor MP1 is serially connected between the first and third PMOS transistors PM1 and PM3. The first PMOS transistor PM1, the first current adjustment transistor MP1, and the third PMOS transistor PM3 are serially connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The second current adjustment transistor MP2 is serially connected between the second and fourth PMOS transistors PM2 and PM4. The second PMOS transistor PM2, the second current adjustment transistor MP2, and the fourth PMOS transistor PM4 are connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied.

The current adjustment transistors included in the current adjustment circuit 910 may be turned on or off according to the input signal Vin. For example, when the input signal Vin is in a low level, the first current adjustment transistor MP1 may be turned on, and the second current adjustment transistor MP2 may be turned off. When the input signal Vin is in a high level, the first current adjustment transistor MP1 may be turned off, and the second current adjustment transistor MP2 may be turned on. Accordingly, power consumption of the current adjustment transistors included in the current adjustment circuit 910 may be less than it would be compared to a circuit in which the current adjustment transistors are always turned on.

The level shifting circuit 900 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 900 may be prevented.

Figure 11:
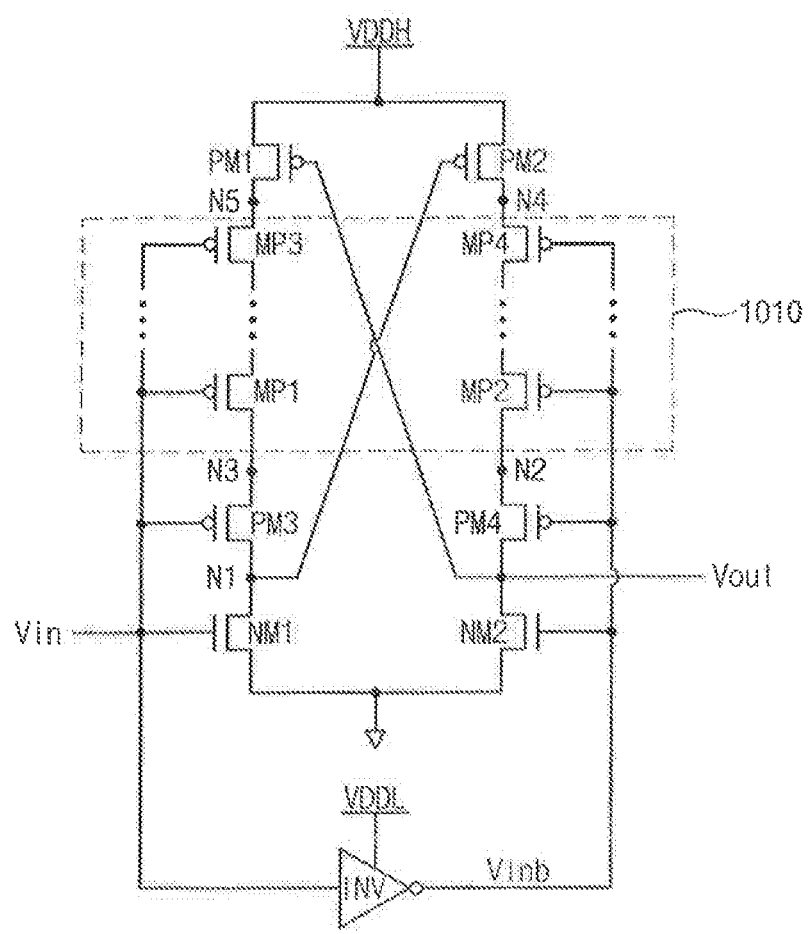

FIG. 11 is a circuit diagram illustrating a level shifting circuit 1000 according to an exemplary embodiment of the inventive concept. Referring to FIG. 11, a level shifting circuit 1000 includes p-type (PMOS) transistors PM1 to PM4, and MP1 to MP4, and n-type (NMOS) transistors NM1 and NM2. The types of transistors are exemplary. Exemplary embodiments of the inventive concept are not limited thereto. The level shifting circuit 1000 amplifies a voltage level of the input signal Vin to output the output signal Vout. A level shifting operation of the level shifting circuit 1000 may be the same as or similar to a level shifting operation of the level shifting circuit 10 illustrated in FIG. 1. Accordingly, a further description thereof, and a further description of elements previously described, may be omitted herein.

One end of each of the first and second PMOS transistors PM1 and PM2 is connected to a node at which the drive high voltage VDDH is applied. A gate terminal of the first PMOS transistor PM1 is connected to a node at which the output signal Vout is applied. The other end of the first PMOS transistor PM1 is connected to a fifth node N5. A gate terminal of the second PMOS transistor PM2 is connected to a first node N1. The other end of the second PMOS transistor PM2 is connected to a fourth node N4.

One end of the third PMOS transistor PM3 is connected to a third node N3. A gate terminal of the third PMOS transistor PM3 is connected to a node at which the input signal Vin is applied. The other end of the third PMOS transistor PM3 is connected to the first node N1. One end of the fourth PMOS transistor PM4 is connected to a second node N2. A gate terminal of the fourth PMOS transistor PM4 is connected to a node at which the inverted input signal Vinb is applied. The other end of the fourth PMOS transistor PM4 is connected to the node at which the output signal Vout is applied.

The level shifting circuit 1000 includes a current adjustment circuit 1010. The current adjustment circuit 1010 includes, for example, first to fourth current adjustment transistors MP1 to MP4. One end of the third current adjustment transistor MP3 is connected to the fifth node N5. One end of the fourth current adjustment transistor MP4 is connected to the fourth node N4. One end of the first current adjustment transistor MP1 is connected to the third node N3. One end of the second current adjustment transistor MP2 is connected to the second node N2. At least one PMOS transistor may be serially connected between the first current adjustment transistor MP1 and the third current adjustment transistor MP3, forming a plurality of PMOS transistors. At least one PMOS transistor may be serially connected between the second current adjustment transistor MP2 and the fourth current adjustment transistor MP4, forming a plurality of PMOS transistors. A gate terminal of each of the first and third current adjustment transistors MP1 and MP3 is connected to the node at which the input signal Vin is applied. A gate terminal of each of the second and fourth current adjustment transistors MP2 and MP4 is connected to the node at which the inverted input signal Vinb is applied.

The current adjustment transistors MP1 to MP3 are serially connected between the first and third PMOS transistors PM1 and PM3. The first PMOS transistor PM1, the current adjustment transistors MP1 to MP3, and the third PMOS transistor PM3 are connected between the node at which the drive high voltage VDDH is applied and the first node N1. Accordingly, a current flowing between the node at which the drive high voltage VDDH is applied and the first node N1 is smaller than a current that would be flowing if only the first and third PMOS transistors PM1 and PM3 were connected between the node at which the drive high voltage VDDH is applied and the first node N1. The current adjustment transistors MP2 to MP4 are serially connected between the second and fourth PMOS transistors PM2 and PM4. The second PMOS transistor PM2, the current adjustment transistors MP2 to MP4, and the fourth PMOS transistor PM4 are connected between the node at which the drive high voltage VDDH is applied and the node at which the output signal Vout is applied. Accordingly, a current flowing between the node at which the drive high voltage VDDH is applied and the node at which the output signal Vout is applied is smaller than a current that would be flowing if only the second and fourth PMOS transistors PM2 and PM4 were connected between the node at which the drive high voltage VDDH is applied and the node at which the output signal Vout is applied.

The current adjustment transistors included in the current adjustment circuit 1010 may be turned on or off according to the input signal Vin. For example, when the input signal Vin is in a low level, transistors between the first and third current adjustment transistors MP1 and MP3 may be turned on, and transistors between the second and fourth current adjustment transistors MP2 and MP4 may be turned off. For example, when the input signal Vin is in a high level, transistors between the first and third current adjustment transistors MP1 and MP3 may be turned off, and transistors between the second and fourth current adjustment transistors MP2 and MP4 may be turned on. Accordingly, power consumption of the current adjustment transistors included in the current adjustment circuit 1010 may be less than it would be compared to a circuit in which the current adjustment transistors are always turned on.

The level shifting circuit 1000 according to an exemplary embodiment of the inventive concept may reduce the amount of current flowing in each of the first to fourth PMOS transistors PM1 to PM4 compared to the level shifting circuit 10 illustrated in FIG. 1. Accordingly, even when a difference between the drive low voltage VDDL and the drive high voltage VDDH increases, a malfunction of the level shifting circuit 1000 may be prevented.

Figure 12:
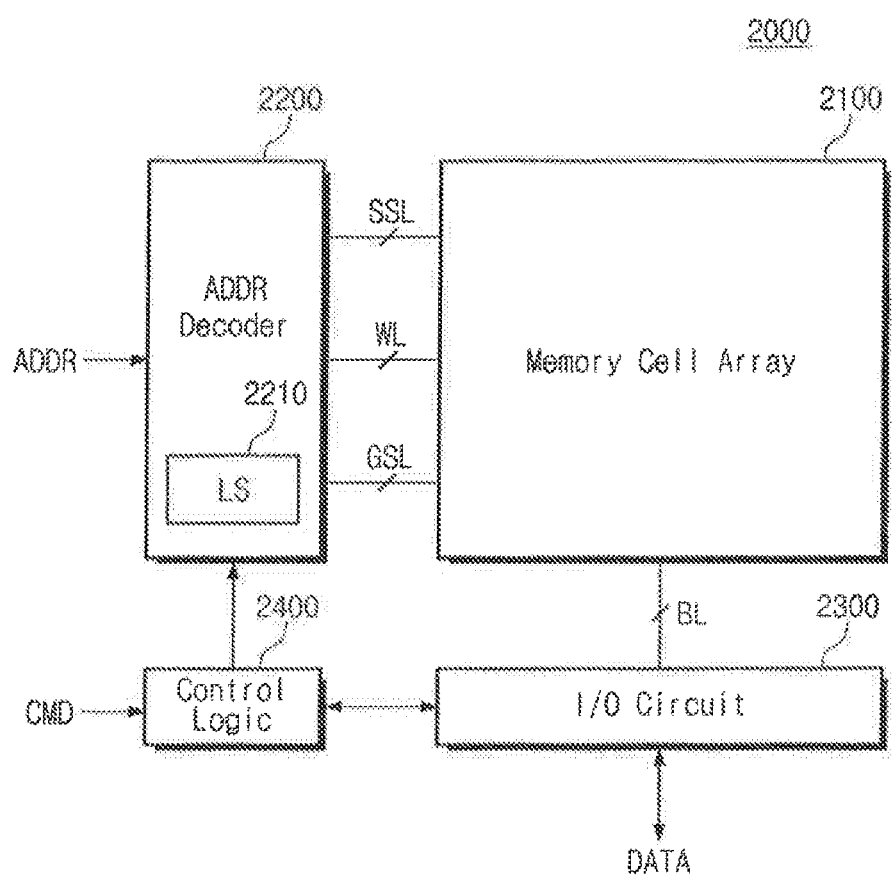
FIG. 12 is a block diagram illustrating a nonvolatile memory device, according to an exemplary embodiment of the inventive concept, in which a level shifting circuit according to an exemplary embodiment of the inventive concept is used.

FIG. 12 is a block diagram illustrating a nonvolatile memory device in which a level shifting circuit according to an exemplary embodiment of the inventive concept is used. Referring to FIG. 12, a nonvolatile memory 2000 may include a memory cell array 2100, an address decoder 2200, an input/output circuit 2300, and a control logic 2400.

The memory cell array 2100 may be connected to the address decoder 2200 through string selection lines SSL, word lines WL, and ground selection lines GSL, and may be connected to the input/output circuit 2300 through bit lines BL. The memory cell array 2100 may include a plurality of memory blocks. Each memory block may include a plurality of memory cells and a plurality of selection transistors. The memory cells may be connected to the word lines WL, respectively. The selection transistors may be connected to the string selection lines SSL or the ground selection lines GSL, respectively. Memory cells of each of the memory blocks may be stacked in a direction substantially perpendicular to a substrate and may be formed to have a three-dimensional structure. The memory cells of each of the memory block may store one or more bits.

The address decoder 2200 may be connected to the memory cell array 2100 through the string selection lines SSL, the word lines WL, and the ground selection lines GSL. The address decoder 2200 may be configured to operate under the control of the control logic 2400. The address decoder 2200 may receive an address ADDR from an external device.

The address decoder 2200 may be configured to decode a row address of the received address ADDR. The address decoder 2200 may select the string selection lines SSL, the word lines WL, and ground selection lines GSL using the decoded row address. The address decoder 2200 may receive various voltages from the control logic 2400, may transmit the received voltages to each of the string selection lines SSL, the word lines WL, and the ground selection lines GSL, which are selected or unselected.

The address decoder 2200 may include a level shifting circuit 2210. The address decoder 2210 may convert various voltages received from the control logic 2400 into voltages required according to an operation about the string selection lines SSL, the word lines WL, and the ground selection lines GSL, which are selected or unselected. The level shifting circuit 2210 may be a level shifting circuit according to the exemplary embodiments of the inventive concept described with reference to FIGS. 2 to 11. Accordingly, the level shifting circuit 2210 may perform a normal operation regardless of a difference between voltages to be provided to the level shifting circuit 2210.

The input/output circuit 2300 may be connected to the memory cell array 2100 through the bit lines BL and may exchange data DATA with an external device. The input/output circuit 2300 may operate under the control of the control logic circuit 2400.

In an exemplary embodiment, the input/output circuit 2300 may receive data from an external device and may write the received data to the memory cell array 2100. The input/output circuit 2300 may read data from the memory cell array 2100 and may transmit the read data to an external device. The input/output circuit 2300 may read data from a first storage area of the memory cell array 2100 and may write the read data to a second storage area of the memory cell array 2100. For example, the input/output circuit 2100 may be configured to perform a copy-back operation.

In an exemplary embodiment, the input/output circuit 2300 may include components such as, for example, a page buffer (page register), a column selection circuit, and a data buffer. In an exemplary embodiment, the input/output circuit 2300 may include components such as, for example, a sense amplifier, a write driver, a column selection circuit, and a data buffer.

The control logic 2400 may be connected to the address decoder 2200 and the input/output circuit 2300. The control logic 2400 may be configured to control an overall operation of the nonvolatile memory device 2000. The control logic 2400 may be configured to generate various voltages required at the nonvolatile memory device 2000. The control logic 2400 may operate in response to a command CMD transmitted from an external device.

The level shifting circuit according to an exemplary embodiment of the inventive concept may reduce the occurrence of a malfunction regardless of a difference between a drive high voltage and a drive low voltage by reducing a current flowing into a pull-up transistor through a current adjustment circuit.

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A level shifting circuit, comprising:
a first transistor connected between a first ground terminal and a first node, and turned on according to an input signal;
a second transistor connected between the first ground terminal and an output node that outputs an output signal corresponding to the input signal, and turned on according to an inverted signal of the input signal;
a first plurality of current adjustment transistors serially connected between the first node and a third node, and turned on regardless of the input signal;
a second plurality of current adjustment transistors serially connected between the output node and a second node, and turned on regardless of the input signal,
wherein a gate terminal of each of the first plurality of current adjustment transistors and a gate terminal of each of the second plurality of current adjustment transistors is connected to a second ground terminal;
a third transistor connected between the third node and a fifth node, and turned on according to the input signal;
a fourth transistor connected between the second node and a fourth node, and turned on according to the inverted signal of the input signal;
a fifth transistor connected between the fourth node and a drive high voltage node at which a drive high voltage is applied, and turned on according to a voltage level of the third node different from the output node; and
a sixth transistor connected between the fifth node and the drive high voltage node, and turned on according to a voltage level of the second node,
wherein a voltage level of the output signal output from the level shifting circuit is determined based on the drive high voltage, and the output node connected between the second transistor and the second plurality of current adjustment transistors outputs the output signal,
wherein the output node is the only output node of the level shifting circuit that outputs the output signal.

2. The level shifting circuit of claim 1,
wherein the first and second transistors are turned on when a first voltage level is applied to a gate terminal of each of the first and second transistors,
wherein the third to sixth transistors are turned on when a second voltage level different from the first voltage level is applied to a gate terminal of each of the third to sixth transistors.

3. The level shifting circuit of claim 1, wherein each of the first plurality of current adjustment transistors is a p-type transistor.

4. The level shifting circuit of claim 3, wherein each of the second plurality of current adjustment transistors is a p-type transistor.

5. A level shifting circuit, comprising:
a first transistor connected between a first ground terminal and a first node, and turned on according to an input signal;
a second transistor connected between the first ground terminal and an output node that outputs an output signal corresponding to the input signal, and turned on according to an inverted signal of the input signal;
a first current adjustment transistor connected between the first node and a third node, and turned on regardless of the input signal;
a second current adjustment transistor connected between the output node and a second node, and turned on regardless of the input signal,
wherein a gate terminal of the first current adjustment transistor and a gate terminal of the second current adjustment transistor is connected to a second ground terminal;
a third transistor connected between the third node and a fifth node, and turned on according to the input signal;
a fourth transistor connected between the second node and a fourth node, and turned on according to the inverted signal of the input signal;
a fifth transistor connected between the fourth node and a drive high voltage node at which a drive high voltage is applied, and turned on according to a voltage level of the third node different from the output node; and
a sixth transistor connected between the fifth node and the drive high voltage node, and turned on according to a voltage level of the second node,
wherein a voltage level of the output signal output from the level shifting circuit is determined based on the drive high voltage, and the output node connected between the second transistor and the second current adjustment transistor outputs the output signal,
wherein the output node is the only output node of the level shifting circuit that outputs the output signal.

* * * * *